United States Patent [19]
Kondratiuk et al.

[11] Patent Number: 5,243,124
[45] Date of Patent: Sep. 7, 1993

[54] ELECTRONIC MUSICAL INSTRUMENT USING FM SOUND GENERATION WITH DELAYED MODULATION EFFECT

[75] Inventors: Clifford Kondratiuk, Vancouver; Karim Mitha, N. Vancouver, both of Canada

[73] Assignee: Sierra Semiconductor, Canada, Inc., Burnaby, Canada

[21] Appl. No.: 854,080

[22] Filed: Mar. 19, 1992

[51] Int. Cl.$^5$ ............ G10H 7/00; G10H 1/04; H03C 1/00
[52] U.S. Cl. ............................ 84/624; 84/629
[58] Field of Search ......... 84/603, 622, 624, 629, 84/659, 705

[56] References Cited

U.S. PATENT DOCUMENTS

| | | | |
|---|---|---|---|
| 4,018,121 | 4/1977 | Chowning | 84/659 X |
| 4,175,464 | 11/1979 | Deutsch | 84/1.24 |
| 4,249,447 | 2/1981 | Tomisawa | . |
| 4,301,704 | 11/1981 | Nagai et al. | . |
| 4,455,911 | 6/1984 | Yamada | 84/1.19 |
| 4,655,115 | 4/1987 | Nishimoto | 84/1.19 |
| 4,766,795 | 8/1988 | Takeuchi | . |
| 4,783,812 | 11/1988 | Kaneoka | 84/616 X |
| 4,813,326 | 3/1989 | Hirano et al. | . |
| 4,991,218 | 2/1991 | Kramer | 84/622 |
| 5,025,702 | 6/1991 | Oya | 84/659 |
| 5,103,711 | 4/1992 | Iwase | 84/660 |

Primary Examiner—William M. Shoop, Jr.
Assistant Examiner—Jeffrey W. Donels
Attorney, Agent, or Firm—Burns, Doane, Swecker & Mathis

[57] ABSTRACT

A computer having one or more wave tables stored therein is used to synthesize sounds represented by a series of digital samples produced at a sample rate by specifying parameters including a carrier frequency, a modulating frequency and an index of modulation. At each sample time, a modulation value determined during an immediately preceding sample time is scaled to produce a digital control signal. Also at each sample time the modulation value to be used during an immediately succeeding sample time is read from a location of a wave table determined by the modulating frequency, and a carrier value used to produce the digital samples is read from a location of a wave table determined by the carrier frequency and the digital control signal. Modulation effects are therefore delayed by one sample in order to speed execution of the method using the computer. Phase accumulation is performed using a multiplier making it unnecessary to store the sum of all of the previous steps as would be otherwise be required using an additive approach.

21 Claims, 3 Drawing Sheets

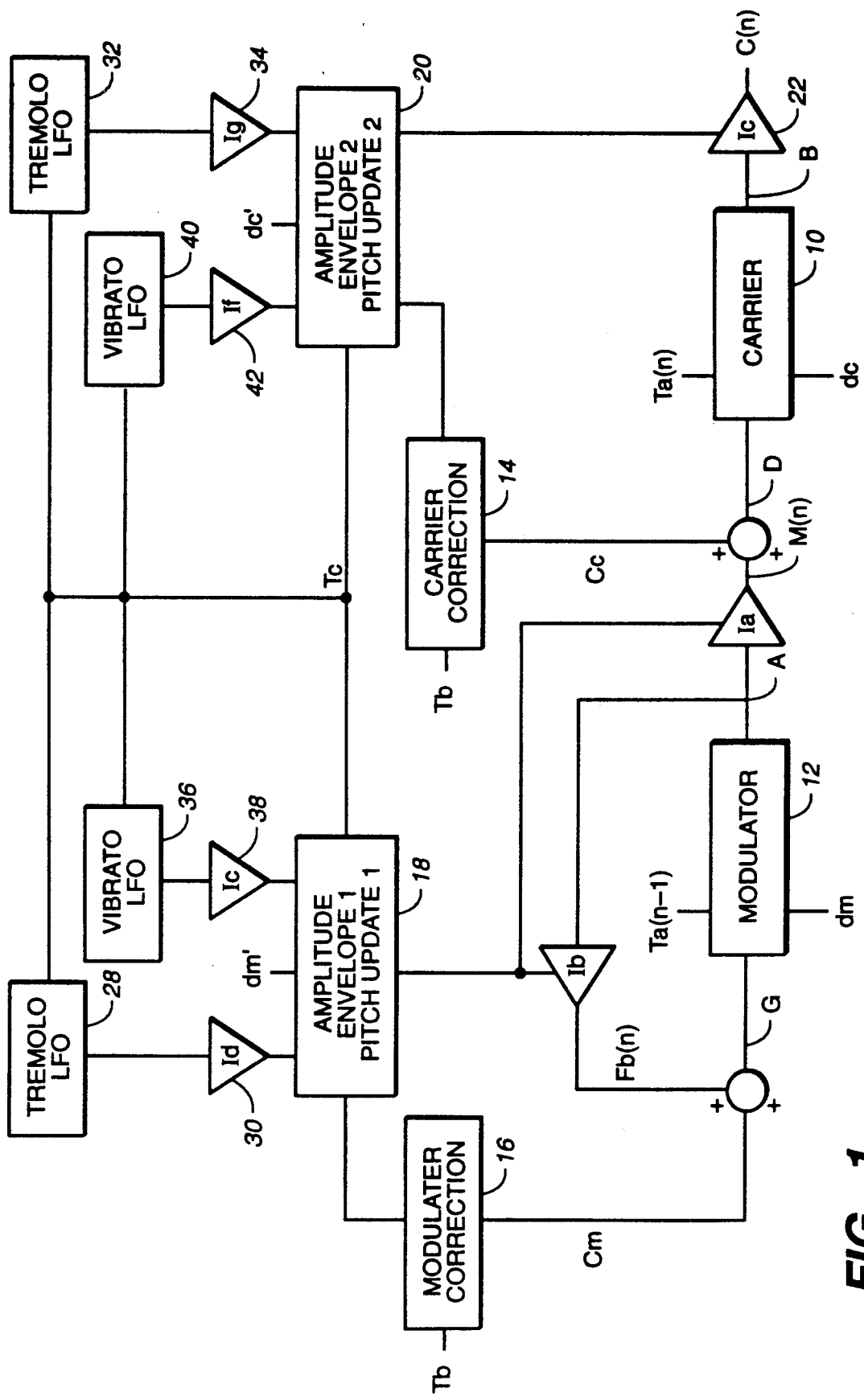
FIG._1

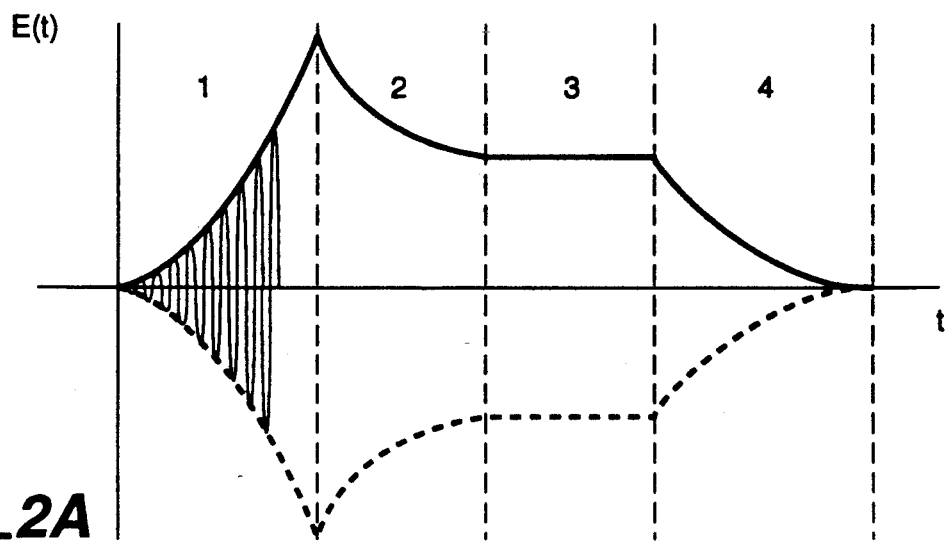
FIG._2A
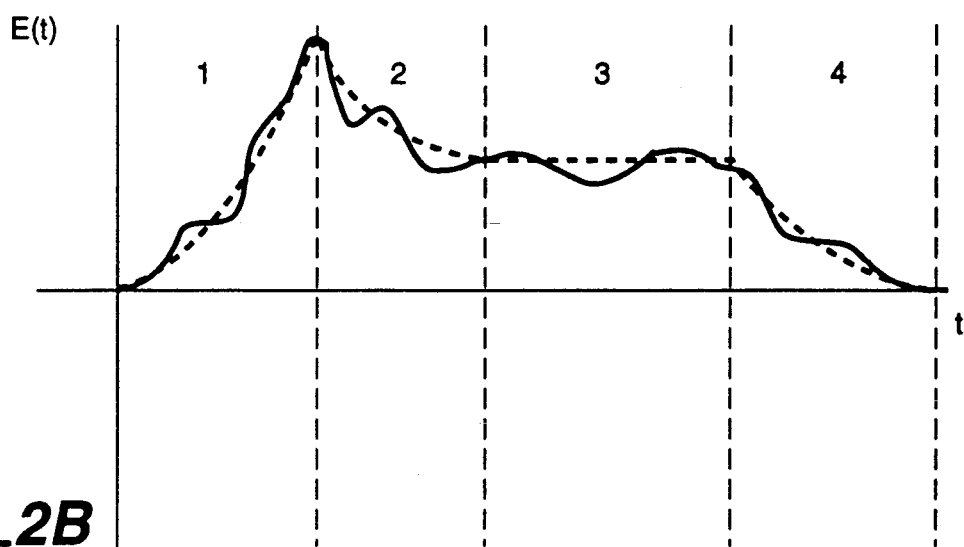
FIG._2B

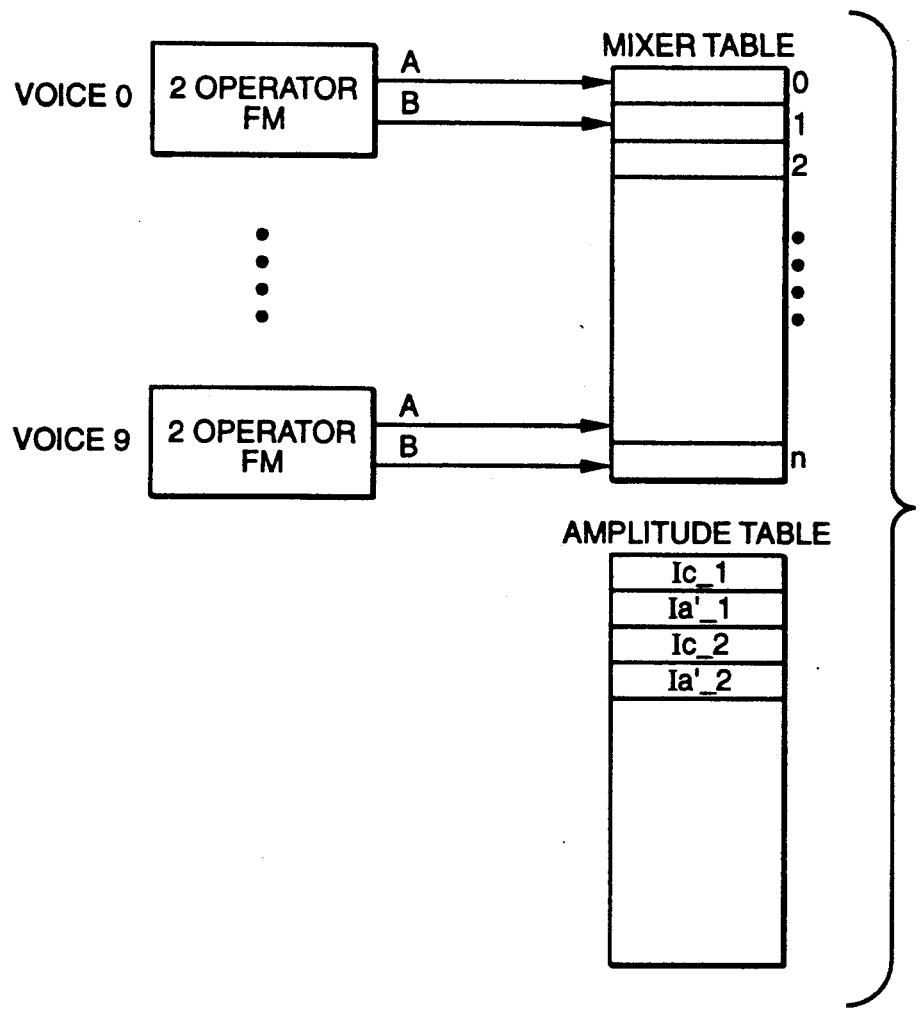
FIG._3
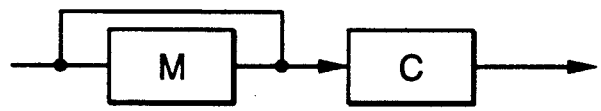
FIG._4A
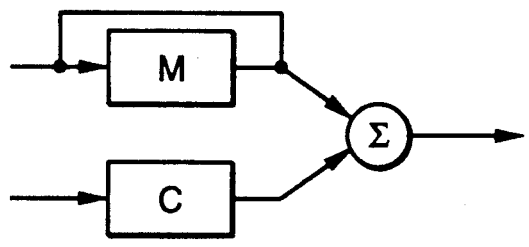
FIG._4B
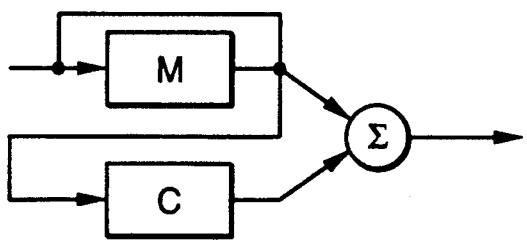
FIG._4C

ELECTRONIC MUSICAL INSTRUMENT USING FM SOUND GENERATION WITH DELAYED MODULATION EFFECT

FIELD OF THE INVENTION

The present invention relates to computer sound generation methods and, more particularly, to computer sound generation methods using two-operator frequency modulation.

STATE OF THE ART

It is well known to generate sound with computers using two-operator frequency modulation techniques. These techniques are discussed, for example, in "The Synthesis of Complex Audio Spectra by Means of Frequency Modulation," John M. Chowning, *Journal of the Audio Engineering Society*, Volume 21, No. 7, September 1973.

In frequency modulation techniques, the instantaneous frequency of a waveform is controllably varied around a central value. In mathematical terms, a two-operator frequency modulated signal can be represented generally by the following equation:

$$e = A \sin[(at) + I \sin(bt)]. \qquad (1)$$

In the foregoing equation, the dependent variable e is the instantaneous amplitude of the modulated carrier, A is a preselected constant value, the variable a is the carrier frequency in radians/second, the variable b is the modulating frequency in radians/second, and the variable I is the modulation index. In practice, the modulation index is usually defined as the ratio of the peak frequency deviation to the modulating frequency. In the foregoing equation, each of the sinusoids usually is referred to as an "operator", hence the designation two-operator frequency modulation.

It is well known to use the function of equation (1) for generating audio signals (i.e., sounds). In particular, various audio effects can be created by varying the index of modulation and the relative magnitudes of the carrier and modulating frequencies. The sounds can be, for example, similar to those produced by conventional musical instruments or can be completely different from those achievable by conventional means. In practice, computer sound generation using frequency modulation usually has required specialized systems. Examples of such systems are found in U.S. Pat. No. 4,018,121 and U.S. Pat. No. 4,175,464.

The frequency modulation function which is expressed by equation (1) is a continuous time function; that is, the function provides a real value e for each and every value of a continuous-time input signal. A discrete-time signal, on the other hand, is a sequence—which is to say, a function defined only for integer values. A digital signal, as that term is generally used, refers to a discrete-time signal whose values are from a finite set. A discrete-time approximation to the classical FM equation can be expressed as:

$$e(n) = A \sin[a(nT) + I \sin(bnT)]. \qquad (2)$$

In conventional practice, the workhorse of digital music synthesis is the table-lookup oscillator. Conceptually, a table-lookup oscillator can be considered as a "black box" having two inputs, an amplitude input and an increment input, and a single output which is the digital equivalent of a sinusoid of the specified frequency and amplitude. A table-lookup oscillator generally includes a) a wave table that stores samples of one full period of a sinusoid (or other periodic waveform) which is sampled at regular intervals, and b) an addressing mechanism. The addressing mechanism allows the wave table to be repeatedly read in a sequential manner according to a specified address increment. Normally, the address increment is accumulated at a constant rate. By varying the magnitude of the address increment, the digital equivalent of sine waves of various frequencies can be produced.

In a basic table-lookup oscillator, if the address increment is equal to 1, the contents of the wave table are repeated in sequence over and over again. If the wave table is assumed to have a length L, and is read at a constant rate R, then the sinusoidal output will have a frequency of R/L hertz (Hz). If the address increment is doubled, then the wave table will be read twice during the time period in which it was previously read only once. Therefore, in this example, the frequency of the sinusoid represented by the samples provided from the wave table will have frequency 2R/L Hz. To produce sinusoidal outputs of different amplitudes, the samples read from the wave table can be scaled by an appropriate amplitude factor.

It is known that basic frequency modulation can be provided by connecting two table-lookup oscillators in cascade, with the output of a modulating oscillator being summed with the increment input of a carrier oscillator. In this cascade arrangement, the increment input of the carrier oscillator impresses a sinusoidal signal on the carrier output signal with the result that the carrier signal has a sinusoidally-varying frequency. In other words, if the frequency of the carrier signal were plotted versus time, the plot would show a sinusoid centered about a frequency specified by the increment input of the carrier oscillator, with the sinusoid having a frequency and an amplitude specified by the increment input and the amplitude input, respectively, of the modulating oscillator. Furthermore, in the cascade arrangement, the amplitude of the modulating sinusoid divided by the frequency of the modulating sinusoid would be the index of modulation, I.

To simulate common musical effects, the basic frequency modulation process just described may be modified using additional oscillators produced by table lookup. For example, tremolo describes the condition in which the sound volume as perceived by the listener fluctuates rapidly. Such an effect may be simulated by using a low frequency oscillator to modulate the amplitude of the carrier signal. Vibrato describes the condition in which the pitch of the sound varies slightly to produce a warmer, more resonant tone. Such an effect may be simulated using a low frequency oscillator to modulate the frequency of the carrier signal. Such low frequency oscillators typically have frequencies in the tens of hertz range.

SUMMARY OF THE INVENTION

The present invention generally provides a system for generating pseudo FM tones in a manner which is relatively efficient and suitable for real-time applications. More particularly, according to the preferred embodiment of the present invention, a computer has one or more wave tables stored therein and is used for synthesizing sounds represented by a series of digital samples produced at a sample rate by specifying parameters including a carrier frequency, a modulating frequency and an index of modulation. At each sample time, a modulation value determined during an immediately preceding sample time is scaled to produce a digital control signal. Also at each sample time the modulation value to be used during an immediately succeeding sample time is read from a location of a wave table determined by the modulating frequency, and a carrier value used to produce the digital samples is read from a location of a wave table determined by the carrier frequency and the digital control signal. Modulation effects are therefore delayed by one sample in comparison to conventional frequency modulation in order to speed execution of the method using the computer. The tones generated using this method differ somewhat from tones generated using conventional method in terms of spectral content and sound quality. The tones generated using the method of the present invention are therefore referred to as pseudo FM tones. Preferably the computer includes an incremental multiplier used to step through a wave table to generate the carrier frequency and the modulating frequency in accordance with step size, or delta values, bearing a predetermined relationship to the carrier frequency and the modulating frequency, respectively, and to the size of the wave table. Using an incremental multiplier makes it unnecessary to store the sum of all of the previous steps as would be otherwise be required using an additive approach.

Accordingly, the present invention provides a discrete-time, digital method of computer sound generation using two-operator frequency modulation. The method can be practiced using readily-available computer hardware and can be performed at high speed to enable real-time operation, i.e., generation of a particular sound without any perceptible delay in response to a command by a user or action by a performer.

BRIEF DESCRIPTION OF THE DRAWINGS

FIG. 1 is a functional block diagram that represents the method of the present invention;

FIG. 2a is a plot of a typical amplitude envelope including attack, decay, sustain and release phases;

FIG. 2b is a plot of the amplitude envelope of FIG. 2a with an additional low-frequency oscillatory signal superimposed thereon;

FIG. 3 is a block diagram illustrating a portion of a digital mixer arrangement; and FIGS. 4a, 4b and 4c are block diagrams illustrating three different modes of operation.

DETAILED DESCRIPTION OF THE PREFERRED EMBODIMENTS

In the system of the present invention, equation (1) is approximated by the following digital discrete-time function:

$$e(n) = A\ sin[a(NT) + Cc + I\ sin\{b((n-1)T) + Cm\}]. \quad (3)$$

In the foregoing function, the modulation effects lag the carrier by one sample time. By way of contrast, in conventional discrete-time representations of the FM equation, the modulation effects do not lag the carrier.

Further according to the method of the present invention, a carrier correction factor Cc and a modulator frequency correction factor Cm are employed to mask certain audio flaws caused by the limited resolution of a microprocessor register. Moreover, the carrier frequency and the modulator frequency, as well as the peak amplitude and the index of modulation, include low frequency oscillators to provide tremolo and vibrato effects similar to those previously described. Finally, the peak amplitude and the index of modulation are shaped by respective envelope functions. Therefore:

a = a + a*P1(nT2)
b = b + b*P2(nT2)
A = [A + A*K1(nT2)]*E1(nT2), and
I = [I + I*K2(nT2)]*E2(nT2)

where P1(nT2), P2(nT2), K1(nT2) and K2(nT2) all define discrete-time varying low frequency oscillators and E1(nT2) and E2(nT2) define discrete-time varying envelope functions.

Referring to FIG. 1, a computer sound generation system is represented by six principal functional blocks: a carrier block 10, a modulator block 12, a carrier correction block 14, a modulator correction block 16, and first and second amplitude envelope/pitch update blocks 18 and 20. Each of the functional blocks will be described in detail below.

The carrier block 10 represents a table-lookup carrier oscillator and, as such, has two frequency-controlling inputs, dc and D that together produce the final frequency of the carrier signal. The input dc specifies an increment, or delta value, for stepping through the carrier wave table. The other input D is, in part, provided by the modulator block 12 for modulating the frequency of the carrier signal. Added to the input from the modulator block 12 to provide the input signal D is a carrier correction factor Cc (described in greater detail below). The carrier block 10 operates at sample times Ta(n) where Ta is the sample rate of the synthesized output. The output carrier signal B is scaled by a scaler 22 having a gain factor Ic which is controlled by the second amplitude envelope block 20.

The modulator block 12 also is a table-lookup oscillator. It has two frequency-controlling inputs dm and G that together produce the final frequency of the modulating signal. The input dm specifies the delta value for stepping through the modulator wave table (which can be the same as or different than the carrier wave table). The other input is from the modulation correction block 16 which produces a modulation correction factor Cm in a manner explained more fully below. Also added to the modulation correction factor is a modulation feedback signal Fb(n). In effect, the modulation feedback signal Fb(n) allows a more complex sound spectrum to be produced by creating further harmonics of the modulation frequency in its own output.

The modulator block 12 operates at sample times Ta(n−1). Accordingly, that the modulating produced at a one sample delay from the carrier. As a result, the produced tones are measurably different than tones produced by conventional frequency modulation techniques.

The modulating signal A is suitably scaled by a scaler 24 having a gain factor of Ia controlled by the first amplitude envelope block 18. The first amplitude envelope block 18 also controls a scaler 26 having a gain factor of Ib used to suitably scale the modulating signal A to produce the modulation feedback signal Fb(n).

The first and second amplitude envelope blocks 18 and 20 generate amplitude envelopes that cause the index of modulation I (determined by feed-forward and feedback gain factors Ia and Ib) and the peak amplitude A (determined by the gain factor Ic) to vary with time as may be appreciated with reference to FIG. 2a. A typical amplitude envelope E(t) might have four distinct phases corresponding to the phases of a note played on a musical instrument. In an attack phase 1, a note is first sounded causing a sharp rise in sound energy, in a decay phase 2 some of the initial energy subsides, in a sustain phase 3 the sound energy remains substantially unchanged for a period of time and in a release phase 4 no further sound energy is produced such that the note dies away. The first and second amplitude envelope/pitch update blocks 18 and 20 also have as inputs a new modulator delta value dm' and a new carrier delta value dc', respectively. These inputs are used to produce pitch glides, or portamenti, in which the pitch glides smoothly through a range of pitches.

Tremolo and vibrato low frequency oscillators (LFOs) provided for both the modulator block 12 and the carrier block 10 affect the modulator and carrier blocks through the first and second amplitude envelope/pitch update blocks 18 and 20. The Tremolo LFO 28 for the modulator block 12 causes the first amplitude envelope to be modulated by an amount controlled using a scaler 30 having a gain factor of Id, and the Tremolo LFO 32 for the carrier block causes the second amplitude envelope to be modulated by an amount controlled using a scaler 34 having a gain factor of Ig. Similarly, the Vibrato LFO 36 for the modulating block causes the pitch of the modulator to be modulated by an amount controlled using a scaler 38 having a gain factor of Ie, and the Vibrato LFO 40 for the carrier block causes the carrier pitch to be modulated by an amount controlled using a scaler 42 having a gain factor of If. The LFOs 28, 32, 36 and 40 and the first and second amplitude envelope/pitch update blocks 18 and 20 are updated at a rate Tc, equal to 1/694 Hz in the preferred embodiment. The effect of the tremolo LFOs on the amplitude envelopes may be seen in FIG. 2b. The amplitude envelope has superimposed thereon a relatively small, low-frequency signal. In FIG. 2b, the effect is exaggerated for purposes of illustration.

More particularly, two types of LFOs are available for use in the present two-operator FM system: a pitch LFO that frequency modulates the operator it is connected to; and an amplitude LFO that amplitude modulates the operator it is connected to. A carrier operator may have a pitch and/or an amplitude LFO connected to it. Likewise, a modulator may have a pitch and/or an amplitude LFO connected to it.

In terms of nomenclature, the effect of a pitch LFO on a carrier is called a vibrato effect on the carrier. The effect of an amplitude LFO on a carrier is called a tremolo effect on the carrier. The effect of a pitch LFO on a modulator may be referred to as a vibrato effect on the modulator. Finally, the effect of an amplitude LFO on a modulator may be referred to as a tremolo effect on the modulator.

The above-described method can be used in connection with an audio adaptor for microprocessor-based computers. Preferrably the audio circuit board, or "sound board", is based on a digital signal processor and can be easily connected to a microprocessor-based computer to enable the computer to play musical compositions and to provide realistic sampled sound effects.

In use of the system of FIG. 1, the generation rate $T_g$ of the synthesized output can be a variable. In practice, the generation rate $T_g$ depends on the overhead experienced by the digital signal processor in processing various commands set by the microprocessor-based computer that controls the operation of the different blocks. That is, the generation rate $T_g$ depends on the number of commands that are being processed by the digital processor at any given time. (It is required, however, that the generation rate of the synthesized output be greater than the sample rate of the synthesized output; i.e., that $T_g > T_a$.) The update rate $T_b$ of the correction factor can also be a variable rate, equal to a small fraction of $T_g$.

As described above, the addressing mechanism of a table-lookup oscillator causes the wave table to be repeatedly read sequentially according to specified address increments, or delta values, that are steadily accumulated. Using a digital signal processor (DSP), the accumulation can be performed by zeroing the accumulator, adding the delta value, storing the contents of the accumulator in a memory location, reloading the accumulator with the stored contents of the memory location, again adding the delta value, and so forth. This additive approach, however, entails considerable overhead in storing the cumulative results. Because different delta values must be accumulated for each of a number of different operators to provide polyphonic sound generation, even a few extra machine cycles can quickly add up to an appreciable delay.

To provide a system that effectively generates polyphonic sound in real-time, an address corresponding to the current location in the stored wave table is generated using an incremental multiplier. This technique avoids the requirement of storing the cumulative results that would otherwise be necessary using an additive approach. A suitable multiplicative algorithm (written in TMS320 assembly language) is set forth in Appendix A. The multiplicative algorithm is described briefly in the following.

In a preferred embodiment, a total of eighteen operators, numbered 0–17, are provided, with the even numbered operators being carrier operators and the odd numbered operators being modulator operators. A total of nine voices are therefore provided, each voice being realized by a modulator/carrier pair according to two-operator frequency modulation. For both the modulator operators and the carrier operators, the values read from the wavetables are stored in data memory locations labelled MIXER__n. To generate polyphonic sound, the MIXER locations are read out at the generation rate, combined in a digital mixer and applied to a digital-to-analog converter.

In the preferred embodiment, the implementation varies slightly from that shown in FIG. 1. The values at points A and B in FIG. 1 are actually what is stored in the locations MIXER__n. The multiplication of the value at point B by Ic is not carried out until the synthesis algorithm has processed all operators. Once all operators have been processed, a mixer algorithm is executed where the data at point B is multiplied by Ic for all operators. This technique is used because of the digital signal processor's high efficiency in performing block multiplies. FIG. 3 and Table 1 below illustrate this concept.

TABLE 1

| MIXER TABLE | (MIXER__n) | Amplitude Table (Ic and Ia,) | | |
|---|---|---|---|---|
| A__0 | X | Ia'__0 | = | M__0 |
| B__0 | X | Ic__0 | = | +C__0 |
| A__1 | X | Ia'__1 | = | +M__1 |
| B__1 | X | Ic__1 | = | +C__1 |
| A__2 | X | Ia'__2 | = | +M__2 |
| B__2 | X | Ic__2 | = | +C__2 |

TABLE 1-continued

| MIXER TABLE | (MIXER_n) | Amplitude Table (Ic and Ia,) | | |
|---|---|---|---|---|
| A_n | X | Ia'_n | = | +M_n |
| B_n | X | Ic_n | = | +C_n |
| | | | | Final output result |

As shown in FIG. 3, the signals A and B for each of the nine voices are stored in a mixer table. Afterwards an amplitude table of identical size as the mixer table is used to scale the signals A and B for each of the voices. Gain factors Ia'_1 to Ia'_n (to be distinguished from the gain factor Ia in FIG. 1) are applied to the B signals. The block multiply is performed by instructions 1-7 and subsequent instructions in Appendix C. By keeping a record of the output value of both the modulator and the carrier in the MIXER locations for each voice, different sound algorithms may be implemented as shown in FIGS. 4a-4c. The system will support three modes of operation. In Mode 0, the standard two operator frequency modulation mode shown in FIG. 4a, the Ia' values in Table 1 are zeroed so that only the carrier output is heard. The actual Ia parameter is, however, not affected. In Mode 1, the additive synthesis mode shown in FIG. 4b, the Ia' parameter equals the Ia parameter, but the M(n) value in FIG. 1 is not fed through to the carrier. Mode 2 shown in FIG. 4c is a combination of Modes 0 and 1 whereby the Ia' parameter equals the Ia parameter and the M(n) is fed through to the carrier as appears in FIG. 1.

Each operator has associated therewith a delta value and a correction factor. The delta value determines the frequency of the operator as previously described. The correction factor compensates for certain hardware limitations experienced implementing a multiplicative algorithm on the digital signal processor.

In particular, frequency modulation requires that the addition of modulation effects be performed by signed arithmetic. In practice, there are ratios of the carrier and modulating frequencies and values of the index of modulation that produce sideband components that fall in the negative frequency domain of the spectrum. These negative components reflect around 0 Hz and "mix" with the components in the positive domain. This feature accounts in part for the special richness of the FM technique.

The delta value used in the TMS320 example is represented in an 8.8 (8-bit integer, 8-bit fraction) format that has a range from 0.0000 to 255.99609375 decimal. The incremental multiplier is stored as a 16-bit signed integer value that has a usable range from 0000H to 7FFFH (0 to +32767 integer). If the incremental multiplier were allowed to reach 8000H the result would be a multiply by −32768, which is not allowable. To avoid the occurrance of such a multiply, the incremental multiplier must be reset to 0000H after reaching the maximum value 7FFFH. An error is therefore caused as compared to the additive approach in which the specified address increment is steadily accumulated without keeping a sample count. If the error introduced were not compensated for, the effect would be to reset the phase of all the operators to zero upon overflow of the multiplier, instead of the phase of the operators transitioning smoothly in accordance with a phase increment corresponding to the specified address increment.

Referring now to the modulation algorithm of Appendix A, the modulator operators are updated using the wave table output result from the previous execution pass of the synthesis algorithm. Recall that the wave table output results in the synthesis algorithm are stored in the MIXER memory locations. In step 1 therefore, the MIXER location corresponding to the first modulator is loaded into the T register (designated to hold the multiplicand of a multiply operation). The wave table value is then multiplied by the feed forward index of modulation for the first modulator. As seen in FIG. 1, for each modulator, the modulator 1) is multiplied by a feed forward index of modulation Ia and has a carrier correction factor Cc for the corresponding carrier added thereto; and 2) is multiplied by a feedback index of modulation Ib and has a corresponding modulator correction factor Cm added thereto.

First in relation to the feed forward path, the wave table-lookup value of the first modulator is multiplied by the feed forward index of modulation Ia in step 2, after which the carrier correction factor of the first carrier is loaded into the accumulator. Next, the MPYA instruction first adds the carrier correction factor to the product of the wave table-lookup value of the first modulator and the feed forward index of modulation. Then the wave table-lookup value of the first modulator is multiplied by the feedback index of modulation.

In step 5, the feed forward result present in the accumulator is stored in the corresponding feed forward memory location for the first modulator. The modulator operators are stored in locations labelled MODULATOR_n, the feed forward outputs being stored in MODULATOR_even and the feedback outputs being stored in MODULATOR_odd locations. The wave table-lookup value of the second modulator is then loaded in the T register, and the first modulator's correction factor is loaded in the accumulator. The MPYA command adds the first modulator's correction factor to the product of the wave table-lookup value for the first modulator and the feedback index of modulation, that product still being present in the P (product) register. Then the wave table-lookup value of the second modulator is multiplied by the feed forward index of modulation for the second modulator, beginning the same process for the second modulator, after which the feedback results for the first modulator are stored in the corresponding memory location. The correction factor for the second modulator is then loaded in the accumulator, and operation proceeds in this fashion.

The aforementioned correction factors, besides compensating for phase shifts in the waveform when the sample count is reset, are also used to compensate for errors produced by the multiplicative approach when the frequency of either the carrier or the modulator is changed. Using an additive approach, when either the first or second delta value is changed indicating a change in frequency, accumulation can simply continue using the new delta value Without producing any error. Using a multiplier, however, changing the delta value introduces an error equal to the difference between the new delta value and the old delta value for each of the previous sample counts.

For example, if the sample count has reached 000AH using a delta value of 0001H for a cumulative delta of 000AH, and the delta value is then changed to 0002H, then at the next sample count the multiplier produces a cumulative delta of 000BH * 0002H=00016H, greater by 000AH then the correct cumulative delta of 000AH+0002H=000CH. In other words, the multiplier will have effectively added to the cumulative delta the difference between the new delta and the old delta for each previous sample count. Therefore, whenever a delta value is changed to a new delta value delta, the corresponding correction factor must be adjusted as follows: correction=correction +(Synth_Count_)(-delta—delta').

Referring to Appendix B, each of the steps of the synthesis algorithm in accordance with a preferred embodiment will be described. In a first step, the incremental multiplier SYNTH_COUNT is loaded into the T register of the digital signal processor. The algorithm then begins calculation of the first carrier operator, CARRIER_0. First, the base address of a wave table for CARRIER_0 is stored from memory into an external hardware addressing register. The accumulator is then loaded with the feed forward output of a first modulator operator, MODULATOR_0, calculated in the modulation algorithm previously described in connection with Appendix A. In step 4, the delta value for the first carrier operator is multiplied by the incremental multiplier resulting in the (unmodulated) lookup location. In the next step, the command MPYA first causes the first modulator operator previously loaded into the accumulator to be added to the current lookup location for the first carrier operator in order to effect modulation of the carrier; then a delta value associated with the first modulator operator is multiplied by the incremental multiplier to give the current lookup location for the modulator.

In step 6, the overall (modulated) table-lookup address for the first carrier is stored in a designated output read location. This value is modulo addressed to the wave table size by the external hardware and added to the wave table's base address. In step 8, the table value for the first carrier is read from the wave table and stored in a corresponding MIXER location. Modulation of the carrier is then complete.

As previously explained, however, the modulator of FIG. 1 also performs self modulation. Accordingly, in step 7 the accumulator is loaded with the feedback output of the first modulator. The base address of the wave table for the first modulator is then set up, and the MPYA instruction then adds the cumulative delta value for the first modulator to the feedback output of the first modulator to arrive at the overall table-lookup address for the first modulator. At the same time, the delta value for the second carrier operator is multiplied by the incremental multiplier. The wave table read operation for the first modulator is then set up and later accomplished in step 13 after the feed forward output of the second modulator has been loaded in the accumulator.

Operation precedes in this fashion until table values have been read for all of the carrier operators and modulator operators. Operation of the synthesis algorithm may be further appreciated from a study of Table 2 below, showing in parallel columns the effect of each instruction on the first carrier operator, Carrier_0, the first modulator operator, Modulator_1 and the second carrier operator, Carrier_2.

TABLE 2

| | Carrier_0 | Modulator_1 | Carrier_2 |
|---|---|---|---|
| 1. | LT SYNTH_COUNT | LT SYNTH_COUNT | LT SYNTH_COUNT |
| 2. | Setup Carrier_0 base | | |
| 3. | ACC← Modulator_0 | | |
| 4. | dc*SYNTH_COUNT | | |
| 5. | (dc*SYNTH_COUNT) + Modulator_0 | dm*SYNTH_COUNT | |
| 6. | Setup Table_0 Address | | |
| 7. | | ACC← Modulator_1 | |
| 8. | Read Carrier_0 value into Mixer_0 | | |
| 9. | | Setup Modulator_1 base | |
| 10. | | (dc*SYNTH_COUNT) + Modulator_1 | $dc_2$*SYNTH_COUNT |
| 11. | | Setup Table_1 address | |
| 12. | | | ACC← Modulator_2 |
| 13. | | Read Modulator output value into Mixer_1 | |

Following the synthesis algorithm, the incremental multiplier SYNTH_COUNT is incremented in preparation for the next pass through the synthesis algorithm and is tested to see if it exceeds 07FFFH. If not, then no correction is necessary and commands 19-29 are jumped over. If the incremental multiplier does exceed 07FFFH indicating multiplier overflow, then the incremental multiplier is reset to 0. The delta value associated with each operator is then examined to determine if a correction is required, and if so, the correction factor associated with the operator in question is updated.

In particular, when the incremental multiplier is incremented by 0001H and overflow is set to occur at 8000H, io only odd delta values will have an error in the result. The introduced error is 8000H when the delta value is represented in 8.8 format. This error corresponds to a phase shift in the waveform of 180° when the wave table is 256 words long. To take the simplest example, if delta is 0001H and the incremental multiplier has overflowed to 8000H then the cumulative delta value is also 8000H such that when the incremental multiplier is reset to 0, giving a cumulative delta value of 0, an error of 8000H results. If on the other hand delta is 0002H, then the cumulative delta value is 10000H. Only the least significant four nibbles are of interest, however, which is 0000H. In this instance therefore, when the incremental multiplier is reset to 0, no error results. In the actual implementation of steps 24-29, instead of adding 8000H to the correction factor, a value of 4000H is added, which is then multiplied by two by performing a shift left by one when the correction factor is loaded into the modulation routines that make use of it. This implementation requires a logical AND operation to be performed in step 27 to mask the bits above the integer result.

The execution of the modulation code will always use the wave table output results from the previous execution path of the synthesis code. As a result, the modulation effects are calculated using the sample from time Ta(n−1) when calculating the synthesis output at time Ta(n). This causes the present method to produce a frequency spectrum that is measurably different from the resulting spectrum when the modulators output is generated using the output from time Ta(n) as in conventional frequency modulation. In comparison to the present method, however, frequency modulation according to conventional methods degrades performance in that the execution time of the method becomes impractically long. The present invention allows execution of the synthesis and modulation algorithms to be performed in two in-line routines instead of in sections. The time savings afforded by not having to reload the T register in the synthesis routine according to the multiplicative method can therefore be translated into higher performance instead of being lost by having to calculate modulation effects at the same time as synthesis is being performed.

It can now be understood that the above-described sound generation method departs from conventional FM sound generation methods in ways that might be considered to produce audio flaws. However, in practice, the audible effect of these flaws is readily masked in a minimum of processing time, with the result that the overall method is faster than conventional methods with only a negligible difference in sound quality. Further, as described above, the speed of the method is further improved by executing a modulation function at a one sample delay from a carrier function. Because tones that are produced by the above-described system exhibit a slightly different spectral quality than tones produced using conventional FM methods, those tones can be called pseudo-FM tones.

In practice, the above-described discrete-time frequency modulation method described herein is implemented on a digital signal processor such as those of the Texas Instruments TMS320 family. Further in practice, the above-described method provides high execution speeds while minimizing data memory storage requirements and adaptability to higher order FM sound generation methods such as four-operator frequency modulation. Still further in practice, the above-described method provides time savings by generating pseudo FM tones and by using correction factors to mask any errors introduced by the present method, thereby preventing the errors from being discerned by the average listener.

It will be apparent to those of ordinary skill in the art that the present invention can be embodied in other specific forms without departing from this spirit or essential character thereof. The presently disclosed embodiments are therefore considered in all respects to be illustrative and not restrictive. The scope of the invention is indicated by the appended claims rather than the foregoing description, and all changes which come within the meaning and range of equivalence thereof are intended to be embraced therein.

APPENDIX A

MODULATION_ALGORITHM
MOD_C1

```
1   LT     MIXER_1           ;T register holds Sin[dm*Ta(n−1) + Cm + Fb(n−1)] Modulator 1
2   MPY    INDEX_FF_0        ;P register holds IaSin[dm*Ta(n−1) + Cm + Fb(n−1)] = M(n)
3   LAC    CORRECTION_0,14   ;Accumulator holds Cc for carrier 0
4   MPYA   INDEX_FB_0        ;Accumulator holds Cc + M(n)
                             ;P register holds IbSin[dm*Ta(n-1) + Cm + Fb(n-1)] = Fb(n)
.5  SACH   MODULATOR_0       ;Cc + M(n) is stored for use in Synth Algorithm
6   LT     MIXER_3           ;T register holds Sin[dm*Ta(n−1) + Cm + Fb(n−1)] for Modulator 3
7   LAC    CORRECTION_1,14   ;Accumulator holds Cm for modulator 1
8   MPYA   INDEX_FF_2        ;Accumulator holds Fb(n) + Cm for modulator 1
9   SACH   MODULATOR_1       ;Cm + Fb(n) is stored for use in Synth algorithm
10  LAC    CORRECTION_2,14   ;Accumulator holds Cc for Carrier 2
     .
     .
     .
END_MODULATION
```

APPENDIX B

SYNTH_ALGORITHM

```
1   LT     SYNTH_COUNT              ;LOAD INCREMENTAL MULTIPLIER INTO THE T
                                    ;REGISTER.
CARRIER_0
2   OUT    WAVE_PAGE0,ROM_PAGEPORT  ;Latches Hardware for wavetable base addresss
3   LAC    MODULATOR_0,7            ;Accumulator holds Cc + M(n) for carrier 0
4   MPY    DELTA_0                  ;P register holds dc*Ta(n) for operator 1
5   MPYA   DELTA_1                  ;Accumulator holds dc*Ta(n) + Cc + M(n) for carrier 0
                                    ;P register holds dm*Ta(n) for modulator 1
6   SACH   OUT_READ,4               ;Latches Integer portion of dc*Ta(n) + Cc + M(n) with wavetable b
                                    ;base address to form lookup address into wavetable
                                    ;dc*Ta(n) + Cc + M(n) is an 8 bit integer 8 bit fraction number, on
                                    ;only the integer is used to offset into a 256 word wavetable
7   LAC    MODULATOR_1,7            ;Accumulator holds Cm + Fb(n) for Modulator 1
8   IN     MIXER_0,ROM_READPORT     ;Mixer location 0 is loaded with magnitude of
                                    ;Sin(dc*Ta(n) + Cc + M(n)]
                                    ;
9   OUT    WAVE_PAGE1,ROM_PAGEPORT  ;Latches Hardware for wavetable base address
10  MPYA   DELTA_2                  ;Accumulator holds dm*Ta(n) + Cm + Fb(n) for modulator 0
11  SACH   OUT_READ,4               ;Latches integer portion of dm*Ta(n) + Cm + M(n) with wavetable
                                    ;base address to form lookup into wavetable
12  LAC    MODULATOR,2,7            ;Accumulator holds Cc + M(n) for carrier 2
13  IN     MIXER_1,ROM_READPORT     ;Mixer location 1 is loaded with magnitude of
```

APPENDIX B-continued

;Sin[dm*Ta(n) + Cm + Fb(n)]

```
END_SYNTH
14  ZALS    SYNTH_COUNT
15  ADDK    1
16  SACL    SYNTH_COUNT
17  ANDK    08000h
18  BZ      NO_CORRECTION
19  ZAC
20  SACL    SYNTH_COUNT
21  LAC     DELTA_0
22  ANDK    1
23  BZ      NO_CORRECTION
24  RSXM
25  ZALS    CORRECTION_0
26  ADLK    04000h
27  ANDK    07fffH
28  SACL    CORRECTION_0
29  SSXM
    .
    .               ;REPEAT FOR ALL OPERATORS
    .
NO_CORRECTION
```

APPENDIX C

```
MIXER
1  ZAC                   ;Zero Accumulator
2  LT    IC_0
3  MPY   MIXER_0         ;P register holds C(n) = IcSin[dc*Ta(n) + Cc + M(n)]
4  LT    IC_2
5  MPYA  MIXER_2         ;Accumulator holds C(n) for carrier 0
6  LT    IC_4
7  MPYA  MIXER_4         ;Accumulator holds C(n) for carrier 0 + C(n) for Carrier 2
```

What is claimed is:

1. A method of synthesizing sounds, represented by a series of digital samples produced at a sample rate, using a computer including a multiplier and using one or more wave tables stored in the computer, the method comprising the steps of:

defining a cycle including a variable number of sample periods and counting a number of sample periods elapsed in the cycle;

specifying a carrier frequency and modulating frequency in terms of a carrier delta value and a modulation delta value, to each be used in addressing a wave table;

multiplying the modulation delta value by a sample count to produce a cumulative modulation delta value;

multiplying the carrier delta value by the sample count to produce a cumulative carrier delta value;

checking the cumulative modulation delta value and the cumulative carrier delta value to determine whether the multiplier has overflowed;

if the multiplier has overflowed, resetting the sample count to 0, beginning a new cycle, and adding respective overflow correction factors to the cumulative modulation delta value and the cumulative carrier delta value such that no discontinuity in the digital samples that would result in an audible discontinuity in the sounds is produced;

at each sample time, scaling a modulation value determined during an immediately preceding sample time to produce a digital control signal;

at each sample time, reading, from a wave table location determined by the modulation delta value, the modulation value to be used during an immediately succeeding sample time, and reading, from a wave table location determined by the carrier delta value and the digital control signal, a carrier value generating a time-varying peak amplitude;

scaling the carrier value according to the peak amplitude to produce the digital samples;

in the course of successive ones of the scaling steps, amplitude modulating at least one of the modulation value and the carrier value in accordance with a low frequency oscillatory signal;

in the course of successive sample times, frequency modulating at least one of the modulation value and the carrier value in accordance with a low frequency oscillatory signal to produce a vibrato effect upon said at least one of the modulation value and the carrier value; and converting said series of digital samples thus produced to an analog audio signal and using said analog audio signal to produce said sounds.

2. The method of claim 1 wherein the carrier value is amplitude modulated to produce a tremolo effect.

3. The method of claim 2 comprising the further step of, in the midst of the cycle, changing at least one of the modulation delta value and the carrier delta value to produce a pitch glide effect.

4. The method of claim 3 comprising the further sept of, after changing the at least one of the modulation delta value and the carrier delta value, calculating a pitch correction factor and adding the pitch correction factor to a corresponding one of the cumulative modulation delta value and the cumulative carrier delta value.

5. The method of claim 4 wherein the pitch correction factor is calculated as (SC−1)(D−D') where SC is a sample count, D' is a new delta value and D is an old delta value.

6. A method of synthesizing sounds, represented by a series of digital samples produced at a sample generation rate, using a computer and one or more wave tables stored in the computer, the method comprising the steps of:

specifying a carrier signal frequency parameter used for defining a carrier signal, a modulation signal frequency parameter used for defining a modulation signal, and an index of modulation used for defining a desired degree of modulation;

multiplying said carrier signal frequency parameter by a sample count to produce a cumulative carrier phase value; multiplying said modulator signal frequency parameter by a said sample count to produce a cumulative modulation phase value;

applying to said cumulative carrier phase value a current carrier correction value such that no discontinuity in the digital samples that would result in an audible discontinuity in the synthesized sounds if produced;

applying to said cumulative modulation phase value a current modulation correction value such that no discontinuity in the digital samples that would result in an audible discontinuity in the modulation effect is produced;

at each sample time, scaling a modulation value determined during an immediately preceding sample time with the index of modulation to produce a digital control signal;

at each sample time, reading, from a wave table location determined by the cumulative modulation phase value, the modulation value to be used during an immediately succeeding sample time, and reading, from a wave table location determined by the current carrier phase value and the digital control signal, a carrier value to produce one of the digital samples; and converting said series of digital samples thus produced to an analog signal and using said analog audio signal to produce said sounds.

7. The method of claim 6 comprising the further steps of:

checking a current sample count value to determine if a sample count multiplier has overflowed, and if the multiplier has overflowed, resetting the sample count to zero, beginning a new cycle, and adding respective overflow correction factors to the current modulation correction value and the current carrier correction value such that no discontinuity in the digital samples that would result in an audible discontinuity in the synthesized sounds is produced.

8. The method of claim 7 comprising the further steps of:

applying an index of modulation envelope generator to the index of modulation for varying the index of modulation control signal with time, and further, applying an amplitude modulating low frequency oscillator to the index of modulation envelope generator to produce a controlled, periodic variation of the index of modulation.

9. The method of claim 7 comprising the further steps of:

applying an amplitude envelope generator to a carrier signal waveform for varying an amplitude envelope of the carrier signal waveform with time, and further applying an amplitude modulating low frequency oscillator to the amplitude envelope generator to produce a tremolo effect on a resulting sound waveform when the amplitude envelope is applied to the carrier signal wave.

10. A method of synthesizing sounds represented by a series of digital samples produced at a sample generation rate, using a computer and one or more waves tables stored in the computer, the method comprising the steps of:

specifying a carrier signal frequency parameter used for defining a carrier signal, a modulation signal frequency parameter used for defining a modulation signal, and an index of modulation used for defining a desired degree of modulation;

multiplying said carrier signal frequency parameter by a sample count to produce a cumulative carrier phase value;

multiplying a said modulator signal frequency parameter by a sample count to produce a cumulative modulation phase value;

changing in the midst of a cycle the specified carrier signal frequency parameter used for defining the carrier signal so as to produce a pitch glide effect, and changing in the midst of the cycle the specified modulation signal parameter used for defining the modulation signal so as to produce a change in the modulation effect;

applying to said cumulative carrier phase value a current carrier correction valve such that no discontinuity in the digital samples that would result in an audible discontinuity in the sounds is produced.

applying to said cumulative modulation phase value a current modulation correction value such that no discontinuity in the digital samples that would result in an audible discontinuity in the modulation effect is produced;

at each sample time, scaling a modulation value determined during an immediately proceeding sample time with the index of modulation to produce a digital control signal;

at each sample time, reading, from a wave table location determined by the cumulative modulation phase value, the modulation value to be used during an immediately succeeding sample time, and reading, from a wave table location determined by the cumulative carrier phase value and the digital control signal, a carrier value to produce one of the digital samples; and converting said series of digital samples thus produced to an analog audio signal and using said analog audio signal to produce said sounds.

11. The method of claim 10 comprising the further steps of:

checking a current sample count value to determine whether an incremental sample count multiplier has overflowed; and if the multiplier has overflowed, resetting the sample count to zero, beginning a new cycle, and adding a respective overflow correction factors to the current modulation correction value and the current carrier correction value such that no discontinuity in the digital sample that would result in an audible discontinuity in the sounds is produced.

12. The method of claim 11 comprising the further steps of:

checking the present carrier signal frequency parameter against a previous carrier signal frequency parameter to determine whether the carrier signal frequency parameter has been changed;

if the carrier signal frequency parameter has been changed, calculating a carrier frequency change correction factor and adding the carrier frequency change correction factor to the current carrier correction value such that no discontinuity in the digital samples that would result in an audible discontinuity in the sounds is produced;

checking the present modulation signal frequency parameter against a previous modulation signal frequency parameter to determine whether the modulation signal frequency parameter has been changed; and if the modulation signal frequency parameter has been changed, calculating a modulation frequency change correction factor and adding the modulation frequency change correction factor to the current modulation correction value such that no discontinuity in the digital samples that would produce an audible discontinuity in the effect of modulation is produced.

13. The method of claim 12 comprising the further steps of:

applying an index of modulation envelope generator to the index of modulation for varying an index of modulation control signal with time, and further applying an amplitude low frequency oscillator to the index of modulation envelope generator to produce a controlled, periodic variation of the index of modulation.

14. The method of claim 12 comprising the further steps of:

applying an amplitude envelope generator to the carrier signal waveform for varying the amplitude envelope of the carrier signal waveform with time, and further applying an amplitude modulating low frequency oscillator to the amplitude envelope generator to produce a tremolo effect on a resulting sound waveform when the amplitude envelope is applied to the carrier signal waveform.

15. A method of synthesizing sounds, represented by a series of digital samples produced at a sample generation rate, using a computer and one or more wave tables stored in the computer, the method comprising the steps of:

specifying a carrier signal frequency parameter used for defining a carrier signal, a modulation signal frequency parameter used for defining a modulation signal, and an index of modulation used for defining a desired degree of modulation;

multiplying said carrier signal frequency parameter by a sample count to produce a cumulative carrier phase value;

multiplying said modulator signal frequency parameter by said sample count to produce a cumulative modulation phase value;

changing in the midst of a cycle the specified signal frequency parameter used for defining the carrier signal so as to produce a pitch glide effect, and changing in the midst of a cycle the specified modulation signal parameter used for defining the modulation signal so as to produce a change in the modulation effect;

applying a low frequency oscillator to the carrier signal frequency parameter as a mean of producing a vibrato effect, and applying a low frequency oscillator to the modulation signal frequency parameter to produce a change in modulation effect;

applying to the cumulative carrier phase value a current carrier correction value such that no discontinuity in the digital samples that would result in an audible discontinuity in the sounds is produced;

applying to the cumulative modulation phase value a current modulation correction value such that no discontinuity in the digital samples that would result in an audible discontinuity in the modulation effect is produced;

at each sample time, scaling a modulation value determined during an immediately preceding sample time with the index of modulation to produce a digital control signal;

at each sample time, reading, from a wave table location determine by the current modulation phase value, the modulation value, to be used during an immediately succeeding sample time and reading, from a wave table location determined by the current carrier phase value and the digital control signal, a carrier valve to produce one of the digital samples; and converting said series of digital samples thus produced to an analog audio signal and using said analog audio signal to produce said sounds.

16. The method of claim 15 comprising the steps of:

checking he current sample count value to determine whether an incremental sample count multiplier has overflowed; and if the multiplier has overflowed, resetting the sample count to zero, beginning a new cycle, and adding respective overflow correction factors to the current modulation correction value and the correct carrier correction value such that no discontinuity in digital samples that would result in an audible discontinuity in the sounds is produced.

17. The method of claim 16 comprising the further steps of:

checking the present carrier signal frequency parameter against a previous carrier signal frequency parameter to determine whether the carrier signal frequency parameter has been changed;

if the carrier signal frequency parameter has been changed, calculating a carrier frequency change correction factor and adding the carrier frequency change correction factor to the current carrier correction value such that no discontinuity in the digital samples that would result in an audible discontinuity in the sounds is produced;

checking the present modulation signal frequency parameter against a previous modulation signal frequency parameter to determine whether the modulation signal frequency parameter has been changed; and if the modulation signal frequency parameter has been changed, calculating a modulation frequency change correction factor and adding the modulation frequency change correction factor to the current modulation correction value such that no discontinuity in the digital samples that would produce an audible discontinuity in the modulation effect is produced.

18. The method of claim 17 comprising the further steps of:

applying an index of modulation envelope generator to the index of modulation for varying an index of modulation control signal with time, and further applying an amplitude modulating low frequency oscillator to the index of modulation envelope generator to produce a controlled, periodic variation of the index of modulation.

19. The method of claim 17 comprising the further steps of:

applying an amplitude envelope generator to the carrier signal waveform for varying the amplitude envelope of a carrier signal waveform with time, and further applying an amplitude modulating low frequency oscillator to the amplitude envelope generator as a means of producing a tremolo effect on a resulting sound waveform when the amplitude envelope is applied to the carrier signal waveform.

20. A method of synthesizing sounds, represented by a series of digital samples produced at a sample generation rate, using a computer, including a general-purpose digital signal processor, and one or more wave tables store in the computer, the method comprising the steps of:

specifying parameters including a carrier frequency and a modulating frequency;

generating a time-varying index of modulation;

at each sample time, scaling a modulation value determined during an immediately preceding sample time in accordance with said time-varying index of modulation to produce a digital control signal;

at each sample time, reading, from a wave table location determined by the modulating frequency, the modulation value to be used during an immediately succeeding sample time, and reading, from a wave table location determined by the carrier frequency and the digital control signal, a carrier value to produce one of the digital samples; and at a sample output rate less than said sample generation rate, converting said series of digital samples thus produced to an analog audio signal and using said analog audio signal to produce said sounds.

21. A method of synthesizing sounds, represented by a series of digital samples produced at a sample generation rate, using a computer including a general-purpose digital signal processor, one or more wave tables stored in the computer, the method comprising the steps of:

for each of a plurality of voices, specifying a carrier signal frequency parameter used for defining a carrier signal, a modulation signal frequency parameter used for defining a modulation signal, and a index of modulation used for defining a desired degree of modulation;

at each sample time, for each of said plurality of voices, multiplying said carrier signal frequency parameter by a sample count to produce a cumulative carrier phase value and multiplying said modulator signal frequency parameter by said sample count to produce a cumulative modulation phase value;

at each sample time, checking the current sample count value to determine whether an incremental sample count multiplier has overflowed, and, if the multiplier has overflowed, resetting the sample count to zero, beginning at a new cycle, and, for each of said plurality of voices, adding respective overflow correction factors to the current modulation correction value and the current carrier correction value such that no discontinuity in the digital samples that would result in an audible discontinuity in the sounds is produced;

at each sample time, for each of said plurality of voices, scaling the modulation value determined during an immediately proceeding sample time with the index of modulation to produce a digital control signal;

at each sample time, for each of said plurality of voices, reading, from a wave table location determined by the cumulative modulation phase value, the modulation value to be used during an immediately succeeding sample time, and reading, from a wave table location determined by the current phase value and the digital control signal, a carrier value to produce one of the digital samples;

at each sample time, subsequent to said reading step, and for each of said plurality of voices, applying an index of modulation envelope generator to the index of modulation for varying an index of modulation control signal with time, and applying an amplitude envelope generator to the carrier signal waveform for varying the amplitude envelope of the carrier signal waveform with time;

at intervals separated by a large number of sample times, applying an amplitude modulating low frequency oscillator to the index of modulation envelope generator to produce a controlled, periodic variation of the index of modulation, and applying an amplitude modulation low frequency oscillator to the amplitude envelope generator to produce a tremolo effect on the resulting sound waveform as the amplitude envelope is applied to the carrier signal waveform; and converting said series of digital samples thus produced to an analog audio signal and using said analog audio signal to produce said sounds.

* * * * *